(12) United States Patent
Telecco

(10) Patent No.: US 7,580,291 B2
(45) Date of Patent: Aug. 25, 2009

(54) DATA REGISTER WITH EFFICIENT ERASE, PROGRAM VERIFY, AND DIRECT BIT-LINE MEMORY ACCESS FEATURES

(75) Inventor: Nicola Telecco, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 617 days.

(21) Appl. No.: 11/422,960

(22) Filed: Jun. 8, 2006

(65) Prior Publication Data

US 2008/0005416 A1    Jan. 3, 2008

(51) Int. Cl.
  G11C 16/06    (2006.01)
  G11C 7/10    (2006.01)
  G11C 7/02    (2006.01)
(52) U.S. Cl. .......................... 365/185.22; 365/185.21; 365/189.05; 365/205
(58) Field of Classification Search ............. 365/185.22
  See application file for complete search history.

(56) References Cited

U.S. PATENT DOCUMENTS

| | | | |
|---|---|---|---|
| 5,509,018 A | 4/1996 | Niijima et al. | |
| 5,588,112 A | 12/1996 | Dearth et al. | |
| 5,701,516 A | 12/1997 | Cheng et al. | |
| 5,787,484 A * | 7/1998 | Norman | 711/159 |
| 5,822,251 A | 10/1998 | Bruce et al. | |
| 5,864,513 A * | 1/1999 | Pascucci | 365/210.1 |
| 5,956,289 A * | 9/1999 | Norman et al. | 365/233.1 |
| 6,021,069 A | 2/2000 | Hung et al. | |
| 6,026,019 A | 2/2000 | Lam | |
| 6,307,400 B1 | 10/2001 | Kim et al. | 326/83 |
| 6,741,111 B1 | 5/2004 | Wu | 327/199 |
| 6,744,279 B2 | 6/2004 | Fischer et al. | 326/81 |
| 7,085,157 B2 * | 8/2006 | Tanaka et al. | 365/185.02 |
| 2004/0013020 A1 | 1/2004 | Choo et al. | |
| 2006/0023512 A1 | 2/2006 | Maejima et al. | |
| 2006/0092716 A1 | 5/2006 | Nam et al. | |

FOREIGN PATENT DOCUMENTS

WO    WO-2007/146532 A2    12/2007

OTHER PUBLICATIONS

PCT Application No. PCT/US07/68947, International Search Report mailed Feb. 27, 2008, 2 pgs.
PCT Application No. PCT/US07/68947, Written Opinion mailed Feb. 27, 2008, 6 pgs.
Sakui, K., et al., "A Sophisticated Bit-by-Bit Verifying Scheme for NAND EEPROM's", *1998 Symposium on VLSI Circuits, Digest of Technical Papers*, (1998),236-237.

* cited by examiner

*Primary Examiner*—Son L Mai
(74) *Attorney, Agent, or Firm*—Schwegman, Lundberg & Woessner P.A.

(57) ABSTRACT

A programmable memory device circuit comprising a sense and programming circuit, a latch circuit, a verify circuit for coupling the latch circuit logic value to a shared indicator line, and a direct memory access circuit coupled to the verify circuit. The DMA circuit couples a bit line to the verify circuit, and the verify circuit couples the direct memory access circuit to a shared verify indicator and DMA line.

20 Claims, 5 Drawing Sheets

DATA REGISTER WITH EFFICIENT ERASE, PROGRAM VERIFY, AND DIRECT BIT-LINE MEMORY ACCESS FEATURES

DESCRIPTION

TECHNICAL FIELD

This invention relates generally to semiconductor electrically programmable read only memories (EPROM), electrically erasable programmable read only memories (EEPROM) and Flash memories. This invention relates specifically to a circuit and method for programming and testing nonvolatile memory cells.

BACKGROUND

Nonvolatile memory devices include a memory array containing a plurality of memory cells, addressing, and programming circuits. Included in the memory device are memory data registers which are generally used to store and retrieve data information stored in a memory cell. A data register can be used to store information that is to be written into a memory cell and may also be used to retrieve and store the information from a memory cell. An internal verify function within the data register includes the ability to verify, at a bit level, the expected polarity or data value stored in a memory cell and to communicate the verification status to a memory controller. Data registers are essential building blocks present in modern semiconductor memories, such as high-density flash memory devices, providing efficient programming and erase functions to verify the data to be stored in the memory cells.

Referring to FIG. 1, a memory array 10, within a memory device, has a plurality of storage or memory cells (not shown) and is coupled to a bit line (BL) select circuit 12. The bit line select circuit 12 selects a bit-line coupled to a memory array 10 of memory cells. In conjunction with a word line selection circuit (not shown), a memory cell is selected and coupled to a sense and program circuit 14. Generally, a selected memory cell is programmed to store an associated data value. During a program operation, data values are loaded into a page data register 16. For example, 512 or 1024 data values may be loaded into the data register 16. A selected memory cell is associated with a single data value in the data register 16. Next, a read operation is performed to determine whether the data value stored in the selected memory cell is correctly programmed.

A latch and verify circuit 17 stores the data value read from the memory cell. A comparison between the data value stored in the selected memory cell and the associated data value in the data register 16 is performed. If the data value read from the selected memory cell and the data value stored in the data register 16 match, then the data value programmed in the selected memory cell is verified, and the programming operation for the selected memory cell ends. If the data value read from the selected memory cell and the associated data value stored in the data register 16 do not match, additional programming steps must be performed on the selected memory cell. Iterative programming steps continue until all of the selected memory cells associated with a page of data values in the data register 16 have been verified.

A direct memory access (DMA) decoding block 18 may be included within a memory device to facilitate testing operations of the memory device. External pads an the memory device integrated circuit are used to access specific bit lines during probe and test operations. Examples of operations performed during a test operation include: applying predetermined voltages to specific memory cells, measuring leakage current, measuring operating currents, and measuring a variety of memory cell characteristics.

Conventional DMA circuitry requires decoding circuitry 19 for selecting a specific bitline. In FIG. 1, the NOR gate 3 represents the final stage of this DMA decoding circuitry 19. In the DMA circuit, the DMA decoding block 18 and the DMA select device 4 selectively couple a selected bit line to a global DMA access line 5. The global DMA access line 5 may be coupled to a pad on the memory device integrated circuit to directly access bit line information from the memory array 10 during a probe or testing operation. It is desirable to use as few devices as possible in the verify circuit 17, and in the DMA decoding circuitry 19. Since, a DMA circuitry 19 is associated with each data value stored in the data register 16, reducing the number of transistors in the DMA decoding circuitry 19 may provide a substantial savings in the layout of the memory device.

SUMMARY

A memory device and method of controlling the memory device in accord with the present invention includes a common verify and DMA (direct memory access) line. Verify and DMA circuits provide an efficient circuit design and layout to perform an internal erase verification or a program verification and provide DMA access to memory device bit lines. DMA access is implemented here without requiring separate DMA decoding circuitry. The DMA (direct memory access) circuit, having direct bit line access, is used for testing and characterizing memory cells within a memory array. The verification circuit and DMA circuit provide an efficient design having a reduced number of transistors.

DETAILED DESCRIPTION

An innovative data register circuit which includes the functions of setting, resetting, internal verification, and DMA access are performed by shared circuits that greatly reduce the transistor count and routing congestion within the memory device or integrated circuit. Shared circuits may provide a more compact and efficient memory layout. The concept of sharing circuits between groups of data registers provides an improvement to the layout efficiency of the memory device.

A controller, internal to a memory device, controls a program operation on a selected memory cell. When the selected memory cell is programmed, the data value in the selected memory cell is compared to the associated single data value stored in a data register to verify that the selected memory cell is properly programmed.

Figure 2:
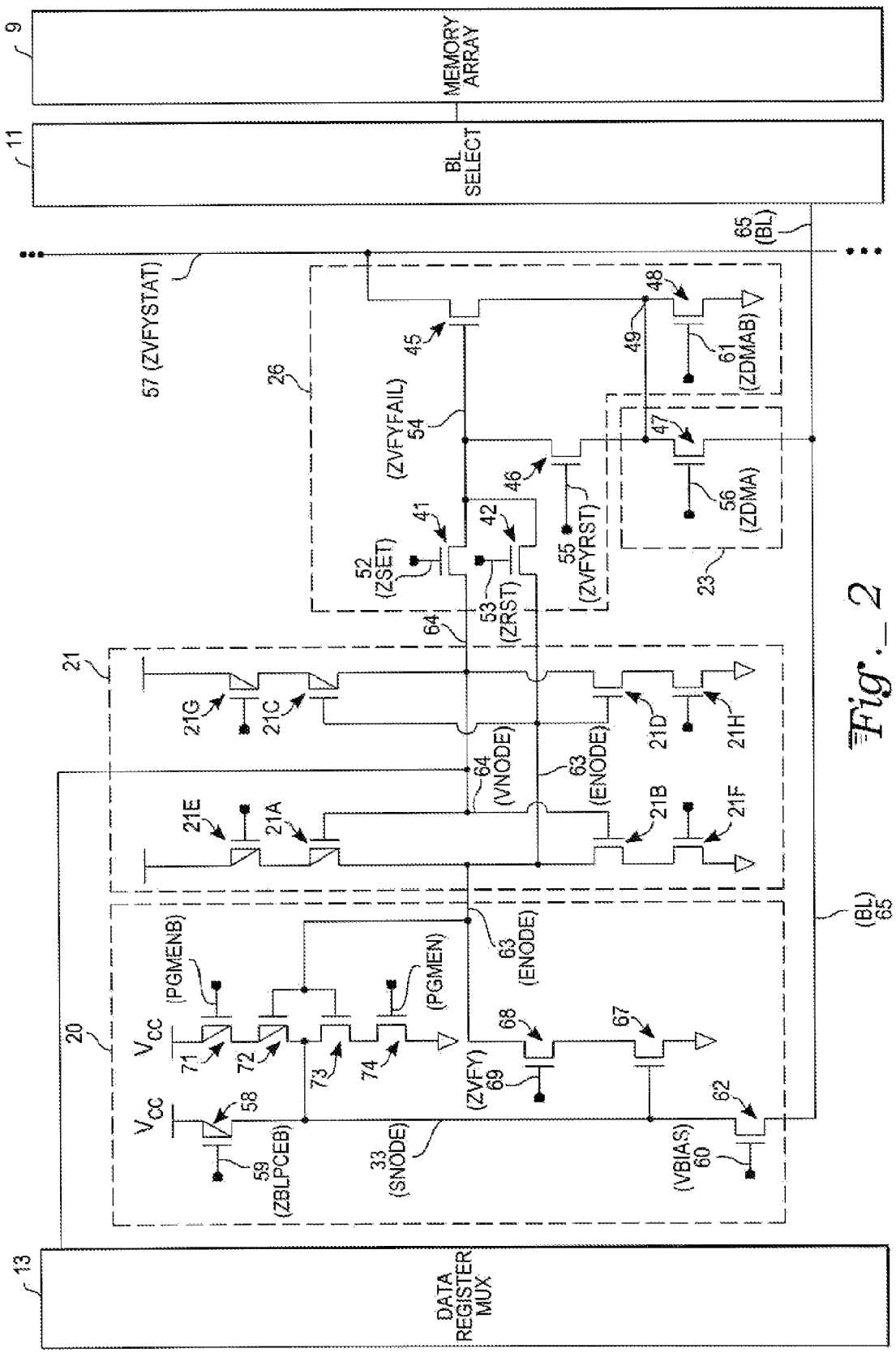
FIG. 2 is an exemplary circuit configured to perform verification and DMA operations.

Referring to FIG. 2, an exemplary circuit within a memory device includes a memory array 9, a bit line select circuit 11, a data register multiplexer (MUX) circuit 13, a sense and program driver circuit 20, a latch circuit 21, a DMA circuit 23, and a verify circuit 26.

The sense and program driver circuit 20 biases selected memory cells within the memory array 9 via the bit line select circuit 11. A bit line precharge device 58 is coupled to a voltage source Vcc and is controlled via the bit line precharge (ZBLPCEB) line 59. The precharge device 58 may be used to precharge a sense node (SNODE) 33 coupled to the gate of a verify pass transistor 67, and to apply bias voltages to selected memory cells through a voltage bias device 62 which is controlled by the voltage bias control (VBIAS) line 60. A verify transistor 68 is coupled to a verify pass transistor 67 and controlled at verify (ZVFY) line 69. The verify pass transistor 67 is also coupled to ground. Transistors 71-74 form a program driver controlled by complementary programmable signals (PGMEN and PGMENB) and an input level from the ENODE 63 of the latch circuit 21. When the program driver is enabled, the SNODE 33 is driven to a value that is the logical inverse of the ENODE value, which then is placed onto the bit line 65 via the voltage bias device 62.

An exemplary embodiment of the latch circuit 21 is implemented using four transistor devices 21A-D configured as two cross-coupled inverters. A first inverter comprised of two transistor devices 21A-B has its input coupled to a (latch) output 64 of a second inverter comprised of two transistor devices 21C-D. The second inverter has its (latch) input 63 coupled to the output of the first inverter. When the input of one of the inverters is driven to a predetermined logic value, its inverted output drives the other inverter and the predetermined logic value is latched into the cross coupled inverters circuit. The latch circuit 21 may be implemented to include tri-state devices 21E-H.

An exemplary embodiment of the verify circuit 26 is implemented using transistor devices 41, 42, 45, 46, and 48. The first verify transistor device 41 is used to set the latch circuit 21 to a predetermined value, and is coupled to a first node (VNODE) 64 of the latch circuit 21. This first verify transistor device 41 is activated via a set (ZSET) line 52. The second verify transistor device 42 is used to reset the latch circuit 21 to a predetermined value, and is coupled to a second node (ENODE) 63 of the latch circuit 21. The second verify transistor device 42 is activated via a reset (ZRST) line 53. The third verify (driver) transistor device 45 is used to drive a global verify indicator and shared DMA (ZVFYSTAT) line 57. The junction of the first and second verify transistors 41, 42 will be referred to as the verify failure (ZVFYFAIL) line 54, which drives the third verify transistor device 45. The fourth verify (discharge) transistor device 46 is controlled by a verify reset (ZVFYRST) line 55, and is used to discharge the verify failure (ZVFYFAIL) line 54, through device 48. Device 48 is activated by a control (ZDMAB) line 61, and is generally used to couple the verify circuit 26 to ground. In particular, the transistor device 48 is generally used in conjunction with the fourth verify transistor device 46 to discharge the verity failure line 54.

An exemplary embodiment of the DMA circuit 23 is implemented using a DMA transistor device 47. The DMA (pass) transistor device 47 is activated by a DMA control (ZDMA) line 56. The DMA transistor device 47 when activated in conjunction with the third verify transistor device 45 electrically couples a selected bit line 65 to the global verify indicator and shared DMA (ZVFYSTAT) line 57. The ZVFYSTAT line 57 can be coupled to an external VCC voltage via a global pull-up device (not shown) of the memory. The discharge transistor device 48 is shut off during all DMA operations. Control lines 56 and 61 are complementary, so only one of DMA transistor 47 and verify discharge device 48 is activated at one time.

The verify circuitry 26 and the DMA circuitry 23 have been illustrated in this example using NMOS transistor devices. Alternatively, they could be constructed using PMOS devices, or using both NMOS and PMOS devices.

The DMA circuit and its test functions are activated by loading a predetermined pattern of 1's and 0's into associated data registers to activate or deactivate the third and fourth verify transistor devices 45, 46. The first DMA pass transistor device 47 is also activated to couple at least one bit line 65 to the global verify indicator and shared DMA (ZVFYSTAT) line 57 during, for example, a test operation.

During a memory transistor programming operation, a programming or voltage pulse is applied to a selected memory cell. If in the course of programming a plurality of memory cells at least one cell has not been properly programmed, additional programming pulses must be applied to complete the programming of those cells. After each programming pulse is applied to a memory cell, the memory cell is read and the logic value stored in the memory cell is verified.

A read (verify) operation is performed on each cell after each respective programming voltage pulse has been applied to the cell, in order to determine whether the resulting voltage of the memory cell is close to a desired stored value. A memory cell is read to verify whether the desired stored value in the memory cell has been reached. During successive write and read operations, a write pulse voltage is increased in amplitude. Write pulses to a selected memory cell are decoupled from the voltage pulse circuits after the information read from the selected memory cell has been verified to equal the value held in the latch circuit that is associated with the selected memory cell.

For this particular nonvolatile memory technology, in order to program a particular memory cell, the bit line 65 is discharged to ground. In order to inhibit programming of a selected memory cell, the bit line 65 is coupled to a supply voltage Vcc or a programming bias voltage. During a program operation, a particular memory cell is coupled to the bit line through the program driver circuit (transistors 71-74) and the bias device 62. The latch node 63 will initially assume a high logic state if the memory cell is intended to be programmed, and will initially assume a low logic state if programming of that cell is inhibited. The latch circuit 21 is driven to this pre-programmed state by applying any positive pulse to the reset (ZRST) line 53. The verify fail (2VFYFAIL) line 54 must be at ground in order to accomplish the reset.

During an internal program a verify operation, the set (ZSET) line 52 and reset (ZRST) line 53 are initially held to a "0" or a low logic state. In this initial state, the latch output 64 will not be coupled to the verify fail line 54. After seizing, the latch node 63 will flip to a low logic state to indicate the associated memory cell has been correctly programmed, but will remain at a high state if the programming of the memory cell is incomplete.

Figure 3:
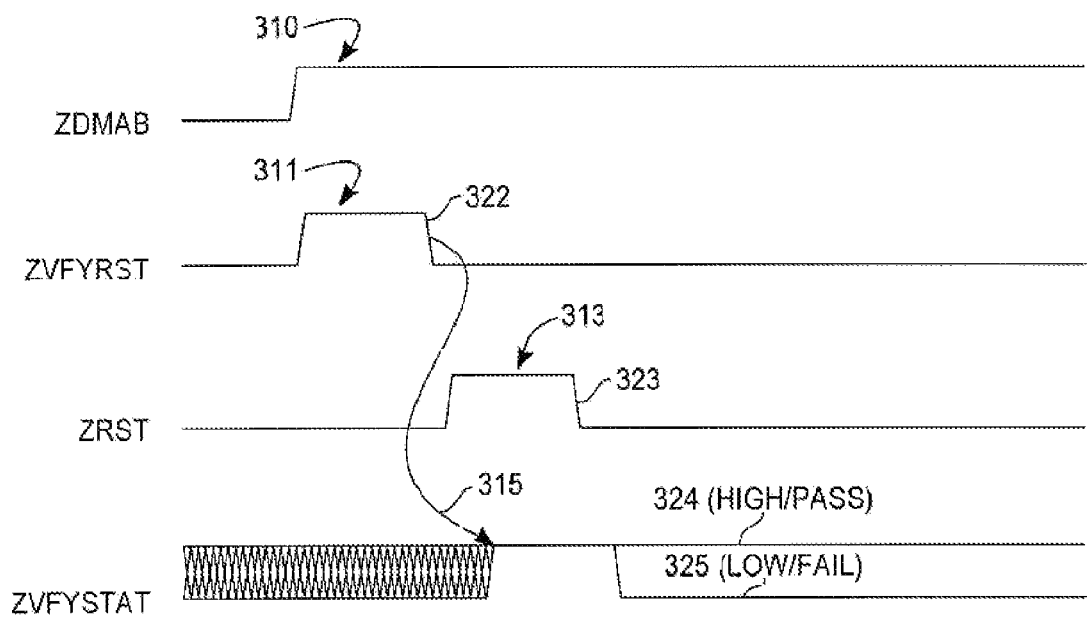
FIG. 3 is an exemplary internal verify timing diagram for the exemplary circuit of FIG. 2.

Referring to FIG. 3, with continued reference to FIG. 2, at the start of a verify operation, a positive voltage 310 is applied to the second DMA control (ZDMAB) line 61, and stays high for the duration of the verify operation. Node 49 discharges to ground. A positive pulse 311 applied to the verify reset (ZVFYRST) line 55 selectively activates the DMA and verify discharge transistors 46 and 48, and thereby dischargers the verify fail (ZVFYFAIL) line 54. A positive pulse 313 applied to the reset (ZRST) line activates the program verify transistor 42 and couples the verify fail (ZVFYFAIL) line 54 to ENODE 63 of the latch circuit 21. If the verify fail (ZVFY-FAIL) is now high, transistor 45 is active and couples the ZVFYSTAT line 57 to ground via transistor 48 at node 49. Thus, if all bits have been programmed successfully (no fails), ZVFYSTAT line 57 stays high, indicating that the program verify has passed. If any one bit has not been completely programmed yet, ZVFYSTAT line 57 will be pulled low, indicating a failure.

A similar operation is performed during an erase operation, except that VNODE 64 will be coupled to the verify fail (ZVFYFAIL) line via transistor 41 using a positive pulse on ZSET.

Figure 1:
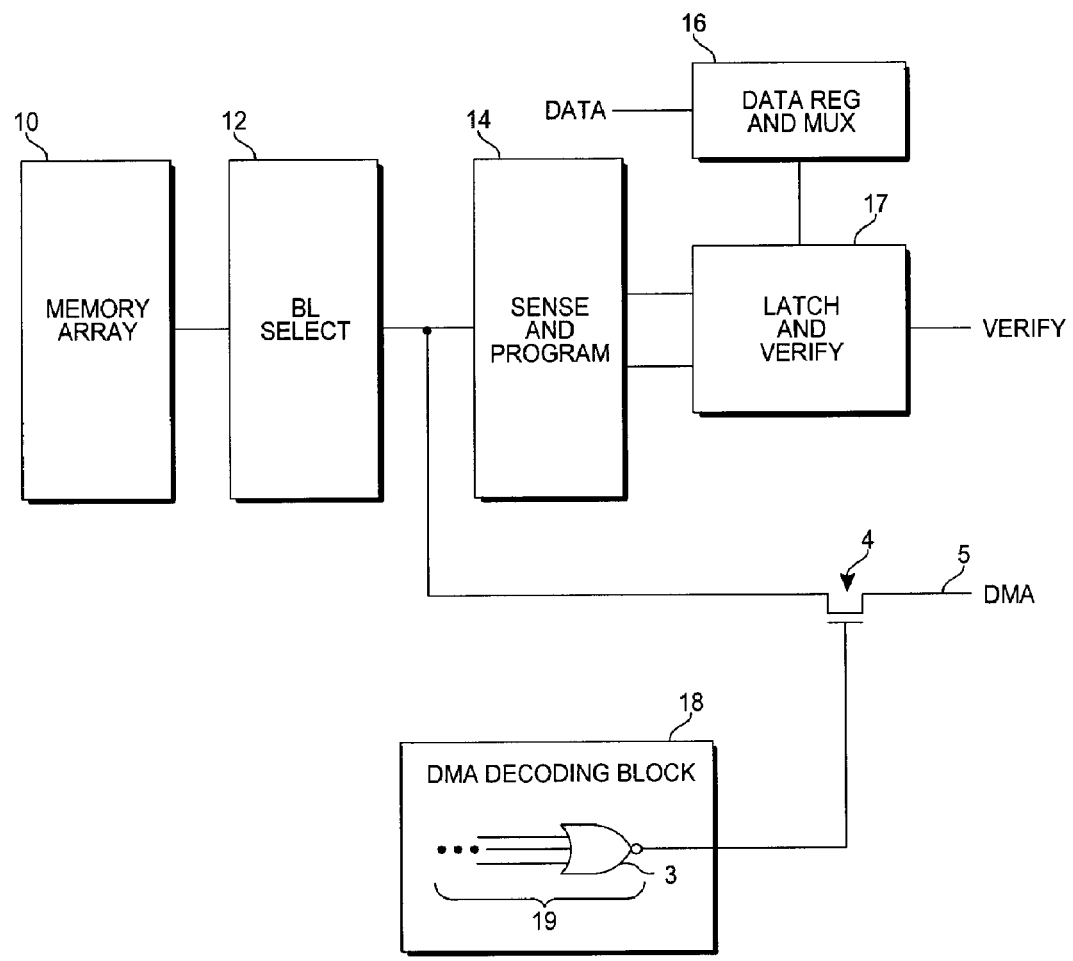
FIG. 1 is a block diagram of verification and DMA functions within a prior art memory device.

Referring to FIG. 1, the DMA line 5 of the prior art is generally implemented as a single NOR gate providing a coupling to a selected bit line. Referring to FIG. 2, the global verify indicator and shared DMA line 57 combine the verify and DMA indicators into a single line. Each verify and DMA circuit is generally associated with a single data register. A reduction in the transistor count in implementing a verify circuit and in a DMA circuit may be realized by combining a global verify indicator line and a global DMA line. A further reduction in the transistor count may be realized by sharing portions of the verify circuit and the DMA circuit between multiple data registers.

For a single data register in a specific exemplary embodiment, six transistors are used. When functions are shared between two data registers, a total of nine transistors are used, or 4 ½ transistors average per data register. When functions are shared between four data registers, a total of 15 transistors are used, or 4 ¼ transistors average per data register. In comparison, the prior art circuit using the NOR gate 3 used 11 transistors for each data register, and therefore the new circuit provides a substantial savings in the device area and savings in the complexity of interconnect lines.

The memory array may also have a global verify indicator line for a group of memory cells within the entire memory array. For example, the memory array may be divided into eight segments (1-8) with each segment having a global verify indicator line (also used for DMA is operations) associated with each segment (1-8).

Figure 4:
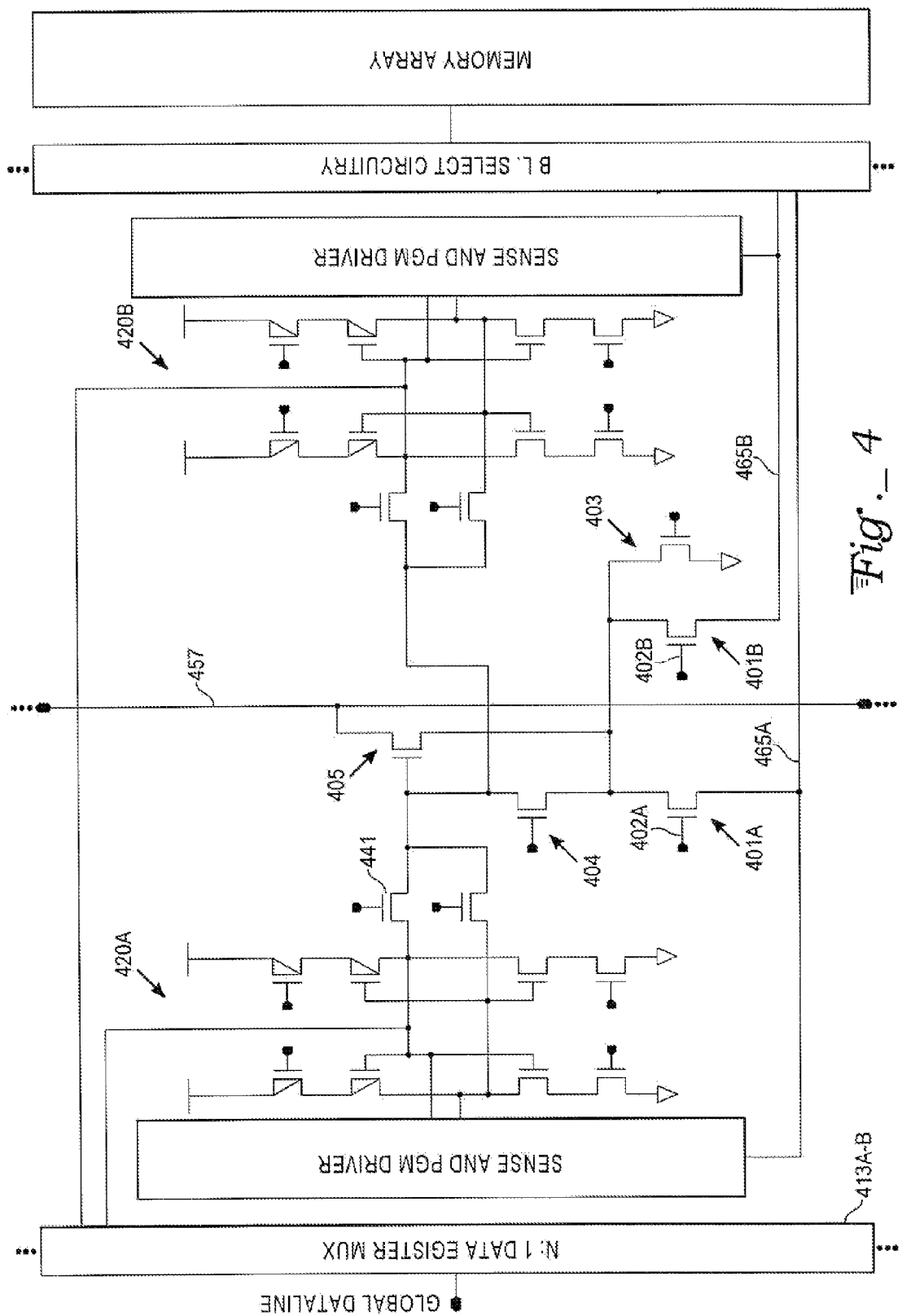
FIG. 4 is an exemplary circuit diagram configured to perform verification and DMA operations with multiple data registers.
Figure 5:
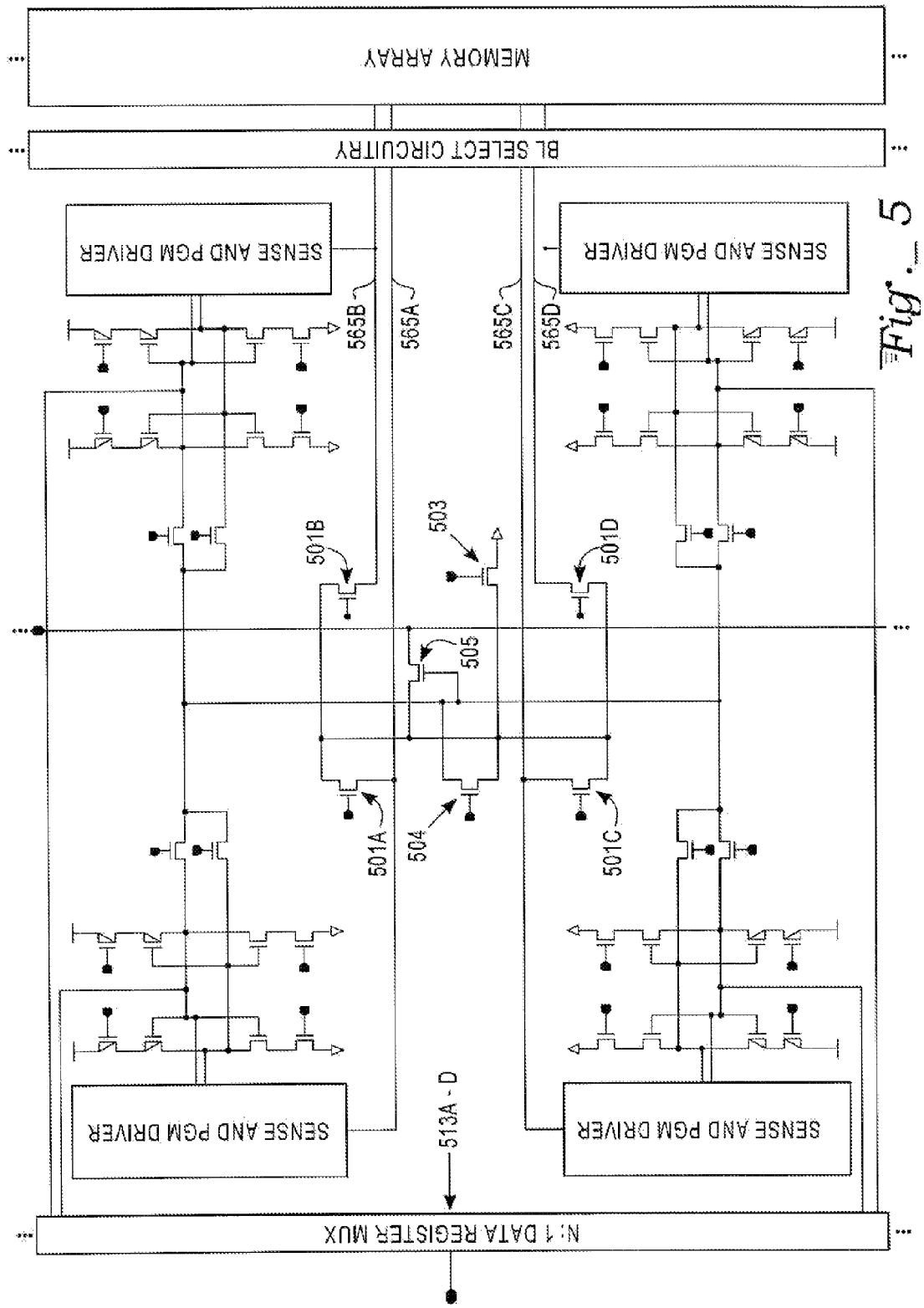
FIG. 5 is an exemplary circuit diagram configured to perform verification and DMA operations with four data registers.

In alternate embodiments, portions of the verify and DMA circuits are shared between multiple or a plurality of data registers. For example, referring to FIG. 4, two data registers share portions of the same verify and DMA circuit. In a shared configuration, the DMA (pull down) transistor 403, the verify (reset) transistor 404, and the verify (driver) transistor 405, are shared between a plurality of data registers and/or bit lines. In a shared configuration, each data register 413A-B or bit line 465A, 465B continues to have an associated DMA pass gate transistor 401A, 401B. Each DMA pass gate transistor 401A, 401B may be coupled to a bit line that is associated with either an even or odd bit line. In another example, referring to FIG. 5, four data registers share portions of the same verify and DMA circuit. Each data register 513A-D or bit line 565A-D, continues to have an associated DMA pass gate transistor 501A-D. A DMA (pull down) transistor 503, the verify (reset) transistor 504, and the verify (driver) transistor 505, are shared.

Referring again to FIG. 4, DMA pass gate transistors 401A, 401B are normally activated during testing and characterization operations. DMA pass gate transistors 401A, 401B, when activated, provide the ability to couple an individual bit line, or simultaneously couple multiple bit lines to a global verify indicator and shared DMA line 457. The verify transistor 405 is coupled to both DMA select transistors 401A, 401B and activated in conjunction with either DMA select transistors 401A, 401B to couple an individual bit line or multiple bit lines to the global verify indicator and shared DMA line 457. When more than one DMA pass transistor 401A, 401B is activated, and the global verify indicator and shared DMA line 457 is shared, individual data values, or specific patterns of data values, are loaded into the data register to load specific values into each latch 420A, 420B. The verify transistor 405 is selectively activated to couple the DMA pass transistors 401A, 401B to the global verify indicator and shared DMA line 457 by coupling the set transistor 441. For example, the set transistor 441 may be activated to pass a logic value from the latch 420A, 420B to the verify transistor 405.

Additionally, all of the DMA pass transistors may be simultaneously activated, coupling all of the bit lines to the global verify indicator and shared DMA line 457 during a test procedure to test the overall leakage of the entire memory array. Other tests may also be conducted on an entire memory array, or selected portions, or selected memory cells, for example, for characterization tests without the need for a decode circuit to drive the DMA circuits.

What is claimed is:

1. A programmable memory device circuit comprising:
    a sense and programming circuit configured to be selectively coupled to a memory tell bit line;
    a latch circuit coupled to the sense and program circuit, the latch circuit configured to store a predetermined logic value;
    a verify circuit coupled to the latch circuit, the verify circuit configured to couple the latch circuit logic value to a shared indicator line;
    a direct memory access circuit coupled to the verify circuit, the direct memory access circuit configured to couple a bit line to the verify circuit; and
    the verify circuit being further configured to couple the direct memory access circuit to the shared indicator line.

2. The programmable memory device of claim 1, wherein the latch circuit includes tri-state devices that enable or disable the latch circuit.

3. The programmable memory device of claim 1, wherein the verify circuit is shared between a plurality of data register circuits.

4. The programmable memory device of claim 1, wherein the verify circuit, in combination with the direct memory access circuit, is configured to couple the bit line to the shared indicator line.

5. The programmable memory device of claim 1, wherein the verify circuit, in combination with the direct memory access circuit, is configured to couple a ground voltage to a control input of a verify driver transistor, 6. The programmable memory device of claim 1, wherein a portion of the verify circuit is discharged prior to coupling the latch circuit predetermined logic value to a shared indicator line.

7. Thee programmable memory device of claim 1, further comprising a set and reset transistor coupled to the latch circuit and verify circuit.

8. The programmable memory device of claim 1, further comprising a bit line charge transistor coupled to the bit line and coupled to a charge voltage source.

9. A programmable memory device comprising:
    a sense and programming circuit configured to be selectively coupled to a memory cell bit line;
    a latch circuit coupled to the sense and program circuit, the latch circuit configured to store a predetermined logic value;
    a verify circuit coupled to the latch circuit, the verify circuit including a verify driver transistor coupled to a shared indicator line and a verify discharge transistor configured to discharge a control input of the verify driver transistor;

a direct memory access (DMA) circuit including a DMA pass transistor coupled to the verify discharge transistor and also coupled to a selected bit line, the direct memory access circuit further including a DMA discharge transistor coupled to the verify discharge transistor and also coupled to a ground voltage and configured to couple the verify discharge transistor to the ground voltage; and the verify circuit and the direct memory access circuit each being configured to selectively couple the selected bit line to the shared indicator line.

10. The programmable memory device of claim 9, wherein the latch circuit includes tri-state devices that enable or disable the latch circuit.

11. The programmable memory device of claim 9, wherein the verify circuit is shared between a plurality of data register circuits.

12. The programmable memory device of claim 9, wherein the verify circuit, in combination with the direct memory access circuit, is configured to couple the ground voltage to the control input of the verify driver transistor.

13. The programmable memory device of claim 9 wherein the verify driver transistor is configured to couple the latch circuit predetermined logic value to the shared indicator line.

14. The programmable memory device of claim 9, wherein the verify discharge transistor discharges the control input of the verify driver transistor prior to coupling the latch circuit predetermined logic value to a shared indicator line.

15. The programmable memory device of claim 9, further comprising a set and reset transistor coupled to the latch circuit and verify circuit.

16. The programmable memory device of claim 9, further comprising a bit line charge transistor coupled to the bit line and also coupled to a charge voltage source.

17. A method of controlling a programmable memory device, the method comprising:

activating a verify discharge transistor;

activating a DMA discharge transistor;

discharging a control input of a verify driver transistor;

deactivating the verify discharge transistor and the DMA discharge transistor; and activating simultaneously, the verify driver transistor and a direct memory access (DMA) pass transistor, thereby coupling a selected bit line to a shared indicator line.

18. The method of controlling a programmable memory device of claim 17, further comprising pre-charging the indicator line to a high logic state.

19. The method of controlling a programmable memory device of claim 17, further comprising sharing the verify discharge transistor, the DMA discharge transistor, and the verify driver transistor between a plurality of memory data register circuits.

20. The method of controlling a programmable memory device of claim 17, wherein discharging a verify driver transistor control input is performed by coupling the verify driver transistor control input to a ground voltage.

* * * * *

UNITED STATES PATENT AND TRADEMARK OFFICE
CERTIFICATE OF CORRECTION

PATENT NO. : 7,580,291 B2
APPLICATION NO. : 11/422960
DATED : August 25, 2009
INVENTOR(S) : Nicola Telecco It is certified that error appears in the above-identified patent and that said Letters Patent is hereby corrected as shown below:

In column 1, lines 11-12, delete "(EEPROM)" and insert -- (EEPROM), --, therefor.

In column 1, line 65, delete "an" and insert -- on --, therefor.

In column 3, line 58, delete "verity" and insert -- verify --, therefor.

In column 4, line 50, after "program" delete "a".

In column 4, line 53, delete "seizing," and insert -- sensing, --, therefor.

In column 4, line 64, delete "dischargers" and insert -- discharges --, therefor.

In column 5, line 29, delete "tour" and insert -- four --, therefor.

In column 5, line 39, before "operations)" delete "is".

In column 6, line 24, in Claim 1, delete "tell" and insert -- cell --, therefor.

In column 6, line 49, in Claim 5, delete "transistor," and insert -- transistor. --, therefor.

In column 6, line 54, in Claim 7, delete "Thee" and insert -- The --, therefor.

In column 7, line 24, in Claim 13, delete "claim 9" and insert -- claim 9, --, therefor.

Signed and Sealed this

Sixteenth Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,580,291 B2
APPLICATION NO. : 11/422960
DATED : August 25, 2009
INVENTOR(S) : Nicola Telecco It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 695 days.

Signed and Sealed this

Fourteenth Day of September, 2010

David J. Kappos
*Director of the United States Patent and Trademark Office*